United States Patent
Visser et al.

(10) Patent No.: US 12,191,575 B2
(45) Date of Patent: Jan. 7, 2025

(54) BEAM STEERING ANTENNA SYSTEMS AND METHODS THEREOF

(71) Applicant: Stichting IMEC Nederland, Eindhoven (NL)

(72) Inventors: Huib Visser, Veldhoven (NL); Rainer Oliver Hornung, Eindhoven (NL); Johannes Frederik Dijkhuis, Nijmegen (NL)

(73) Assignee: Stichting Imec Nederland, Eindhoven (NL)

( * ) Notice: Subject to any disclaimer, the term of this patent is extended or adjusted under 35 U.S.C. 154(b) by 693 days.

(21) Appl. No.: 17/369,692

(22) Filed: Jul. 7, 2021

(65) Prior Publication Data
US 2022/0158345 A1 May 19, 2022

(30) Foreign Application Priority Data
Nov. 17, 2020 (EP) .................................... 20207959

(51) Int. Cl.
*H01Q 3/26* (2006.01)
*H01Q 1/50* (2006.01)
*H03F 3/24* (2006.01)

(52) U.S. Cl.
CPC .............. *H01Q 3/2682* (2013.01); *H01Q 1/50* (2013.01); *H03F 3/245* (2013.01); *H03F 2200/451* (2013.01)

(58) Field of Classification Search
CPC .............. H01Q 3/2682; H01Q 21/0037–0068; H01Q 3/30–32; H01Q 3/26; H01Q 13/206
See application file for complete search history.

(56) References Cited

U.S. PATENT DOCUMENTS 4,063,245 A * 12/1977 James .................. H01Q 13/206
                                              343/846
4,297,705 A    10/1981 Boothe
(Continued)

FOREIGN PATENT DOCUMENTS

| EP | 3316400 A1 | 5/2018 |
| WO | 8807786 A1 | 10/1988 |
| WO | 2007057474 A1 | 5/2007 |

OTHER PUBLICATIONS

Zhang, J., S. W. Cheung, and T. I. Yuk. "Compact composite right/left-handed transmission line unit cell for the design of true-time delay lines." IET microwaves, antennas & propagation 6, No. 8 (2012): 893-898.

(Continued)

*Primary Examiner* — Cassi J Galt
(74) *Attorney, Agent, or Firm* — McDonnell Boehnen Hulbert & Berghoff LLP

(57) ABSTRACT

A beam-steering antenna system for improving the angular coverage comprises a transmission line comprising a first end and a second end. The antenna system further comprises a plurality of antenna elements selectively coupled to the transmission line for selectively coupling energy within the transmission line to the plurality of antenna elements. Furthermore, the antenna system comprises a power amplifier coupled to the first end of the transmission line configured to couple-in an input signal into the transmission line during a first operating period. Moreover, the antenna system comprises a delay line coupled to the second end of the transmission line configured to reflect a portion of the input signal into the transmission line, thereby providing a reflection signal during a second operating period.

13 Claims, 9 Drawing Sheets

(56) References Cited

U.S. PATENT DOCUMENTS

| | | | | |
|---|---|---|---|---|
| 4,371,876 | A * | 2/1983 | Nash | H01Q 21/22 |
| | | | | 343/768 |
| 6,191,735 | B1 * | 2/2001 | Schineller | H01Q 3/36 |
| | | | | 333/164 |
| 6,208,203 | B1 * | 3/2001 | Jung | H03F 1/526 |
| | | | | 330/51 |
| 9,118,113 | B2 * | 8/2015 | Mortazawi | H01Q 3/30 |
| 2009/0046025 | A1 * | 2/2009 | Gardner | H01Q 21/064 |
| | | | | 343/893 |
| 2010/0238067 | A1 | 9/2010 | Nakabayashi et al. | |
| 2011/0001677 | A1 | 1/2011 | Strnad | |
| 2016/0141754 | A1 * | 5/2016 | Leyh | H01Q 13/28 |
| | | | | 342/372 |

OTHER PUBLICATIONS

Naeini, Mohammadreza Ranjbar, Mohammad Fakharzadeh, and Forouhar Farzaneh. "Travelling-wave Ka-band frequency scanning antennas for millimeter-wave imaging applications." In 2016 8th International Symposium on Telecommunications (IST), pp. 591-595. IEEE, 2016.

Hall, P. S. "Microstrip linear array with polarisation control." In IEE Proceedings H (Microwaves, Optics and Antennas), vol. 130, No. 3, pp. 215-224. IET Digital Library, 1983.

Partial European Search Report, Application No. EP20207959.6, mailed Apr. 26, 2021, 11 pages.

* cited by examiner

BEAM STEERING ANTENNA SYSTEMS AND METHODS THEREOF

CROSS-REFERENCE TO RELATED APPLICATIONS

The present application is a non-provisional patent application claiming priority to European Patent Application No. 20207959.6, filed Nov. 17, 2020, the contents of which are hereby incorporated by reference.

FIELD OF THE DISCLOSURE

The application relates to beam-steering antenna systems, especially to frequency-scanned array antennas in compact radar applications to direct the antenna beam towards a target or a moving target without rotating the radar or the antennas.

BACKGROUND

Generally, in a frequency-scanned array antenna, the radiating elements are connected to one transmission line. The segments of the transmission line in-between the radiating elements realize the necessary phase shifts for pointing the antenna beam into the desired direction. The phase shifts are frequency dependent since the length of the transmission line measured in wavelengths changes with frequency, and the beam pointing direction will vary linearly with frequency.

However, the angular coverage or so-called scan range, i.e., the angular domain over which the antenna beam is required to be varied, is limited to a fraction of the hemisphere unless special techniques, such as serpentine feeding, are used to increase the line lengths in between the radiators. This limited angular coverage significantly restricts some radar applications, for instance, radar applications surveilling the frontal region, since they require about double of the aforementioned angular coverage. One possible workaround is to use two frequency-scanned antenna arrays instead of one to increase the angular coverage. However, this implementation will be cost-intensive as well as impractical for applications that require a smaller area.

Another possible workaround is to excite the antenna array from both sides sequentially. This is generally implemented by means of circulators, as shown in the U.S. Pat. No. 4,297,705, for instance. However, a circulator is a non-reciprocal device consisting of ferrite parts, which are subjected to a static magnetic field. Hence, permanent magnets are parts of a circulator, and therefore cannot be integrated in solid-state electronics. Moreover, having a plurality of circulators, e.g., for exciting the antenna array from both sides, leads to a larger size of the antenna array, which is also not practical for applications with area constraints.

SUMMARY

Accordingly, aspects disclosed herein provide beam-steering antenna systems and methods for improving angular coverage, especially to address the aforementioned limitations.

According to a first aspect, a beam-steering antenna system for improving the angular coverage is provided. The antenna system comprises a transmission line comprising a first end and a second end. The antenna system further comprises a plurality of antenna elements selectively coupled to the transmission line for selectively coupling energy within the transmission line to the plurality of antenna elements.

Furthermore, the antenna system comprises a power amplifier coupled to the first end of the transmission line configured to couple-in an input signal into the transmission line during a first operating period. Moreover, the antenna system comprises a delay line coupled to the second end of the transmission line configured to reflect a portion of the input signal into the transmission line, thereby providing a reflection signal during a second operating period. In this regard, the first operating period and the second operating period correspond to one time period of the input signal.

Therefore, the beam-steering antenna system according to this aspect facilitates improving the angular coverage of a beam steering or frequency-scanned antenna array by exciting the antenna array from both sides, however, without the necessity of having circulators. Hence, the proposed solution can be effectively implemented in solid-state electronics, while achieving a compact size for the antenna system.

In an example, the delay line is a true-time-delay line further configured to delay the reflection signal for one time period of the input signal. In other words, if the input signal has a time period of T, the delay line is configured to provide a time delay of T/2. Hence, the residual signal or residue or residual energy of the input signal at the delay line, which remains after being radiated through the antenna elements, is delayed by T/2 by the delay line. Afterward, the residual signal is reflected back into the transmission line as the reflection signal, and the delay line further delays the reflection signal by T/2, thereby delaying the reflection signal by T with respect to the input signal.

It is to be noted that the input signal comprises a series of chirps to be transmitted. In the case where there is no pause between the chirps, i.e., transmission of consecutive chirps, which is preferred in the aforementioned implementation, the delay line provides a time delay of T/2 where T is the time period of the input signal. However, if there are pauses between the chirps, the delay condition of the delay line is relaxed to be greater than T/2.

In an example, the power amplifier is further configured to provide an output impedance equal to or close to the line impedance of the transmission line. In addition, the power amplifier is further configured to be switched-on for the first operating period to couple-in the input signal into the transmission line and is further configured to be switched-off for the second operating period to provide termination for the reflection signal. In other words, the power amplifier is configured to provide sufficient termination for the reflection signal to couple-out any remaining energy from the transmission when the power amplifier is switched-off.

This can be achieved by coupling the power amplifier output at the first end of the transmission line directly, while configuring the power amplifier output impedance at a value sufficiently close to the required termination value, e.g., 50 ohms. This can be further achieved by putting a resistor in parallel with the power amplifier output to match the transmission line impedance and to be either switched to ground when the power amplifier is off or connected to ground permanently. In addition, the termination can also be achieved by not switching-off the power amplifier completely, but using a bias (e.g., a bias voltage or a bias current) to tune the output impedance. Moreover, a passive impedance matching network can be incorporated between the power amplifier output and the first end of the transmission line to provide the required impedance matching and/or termination.

Furthermore, the plurality of antenna elements are, in an example, radiating micro-strip transmission line corner-discontinuities and the delay line is, in an example, a micro-strip delay line. In other words, the plurality of antenna elements can be implemented as a transmission line with radiating discontinuities realized in the same technology, e.g., radiating micro-strip transmission line corner-discontinuities, radiating slots in a rectangular waveguide, and the like. In addition, the number of the plurality of antenna elements and/or their arrangement along with the transmission line are implemented such that at the end of the antenna array, i.e., at the second end of the transmission line, about half of the energy of the input signal will be radiated by the antenna elements.

According to a second aspect, another beam-steering antenna system for improving the angular coverage is provided. The antenna system comprises a transmission line comprising a first end and a second end. The antenna system further comprises a plurality of antenna elements selectively coupled to the transmission line for selectively coupling energy within the transmission line to the plurality of antenna elements. Furthermore, the antenna system comprises a first power amplifier coupled to the first end of the transmission line configured to couple-in an input signal over a first time period of the input signal.

Moreover, the antenna system comprises a second power amplifier coupled to the second end of the transmission line configured to couple-in the input signal over a second time period of the input signal. In this context, the first power amplifier and/or the second power amplifier are configured to provide an output impedance equal to or close to a line impedance of the transmission line.

Therefore, this aspect presents a solution for improving the angular coverage of a beam steering or frequency-scanned antenna array by exciting the antenna array from both sides, however, without the necessity of having bulky circulators and/or complex switching arrangements. Hence, the proposed solution can be effectively implemented in solid-state electronics, while achieving a compact size for the antenna system.

In an example, the antenna system further comprises a controller configured to activate and/or deactivate the first power amplifier and/or the second power amplifier sequentially. In this regard, the controller is further configured to activate and/or deactivate the first power amplifier over the first time period of the input signal and wherein the controller is further configured to activate and/or deactivate the second power amplifier over the second time period of the input signal.

In an example, in the case where the first power amplifier is activated and the second power amplifier is deactivated, the first power amplifier is configured to couple-in the input signal into the transmission line and the second power amplifier is configured to provide termination for the transmission line. Further, in an example where the second power amplifier is activated and the first power amplifier is deactivated, the second power amplifier is configured to couple-in the input signal into the transmission line and the first power amplifier is configured to provide termination for the transmission line.

In this regard, the first power amplifier and/or the second power amplifier can be switched-on for the first operating period to couple-in the input signal into the transmission line and further can be switched-off for the second operating period in order to provide termination for the transmission line. In other words, the first power amplifier and/or the second power amplifier is configured to provide sufficient termination for the transmission line to couple-out any remaining energy of the input signal from the transmission when the power amplifier is switched-off.

According to a third aspect, a method for improving the angular coverage of a beam-steering antenna system is provided. The method comprises the step of providing a transmission line comprising a first end and a second end. The method further comprises the step of selectively coupling a plurality of antenna elements onto the transmission line for selectively coupling energy within the transmission line to the plurality of antenna elements.

Furthermore, the method comprises the step of coupling-in, by a power amplifier coupled to the first end of the transmission line, an input signal into the transmission line during a first operating period. Moreover, the method comprises the step of reflecting, by a delay line coupled to the second end of the transmission line, a portion of the input signal into the transmission line, thereby providing a reflection signal during a second operating period. Hence, the proposed solution does not require bulky circulators and, therefore, can be effectively implemented in solid-state electronics, while achieving a compact size for the antenna system.

In an example, the method further comprises the steps of switching-on the power amplifier for the first operating period and switching-off the power amplifier for the second operating period. The power amplifier is configured to couple-in the input signal into the transmission line when the power amplifier is switched-on, i.e., during the first operating period. Moreover, the power amplifier is configured to provide sufficient termination for the reflection signal to couple-out any remaining energy of the input signal from the transmission line when the power amplifier is switched-off, i.e., during the second operating period.

According to a fourth aspect, another method for improving the angular coverage of a beam-steering antenna system is provided. The method comprises the step of providing a transmission line comprising a first end and a second end. The method further comprises the step of selectively coupling a plurality of antenna elements onto the transmission line for selectively coupling energy within the transmission line to the plurality of antenna elements. Furthermore, the method comprises the step of coupling-in an input signal by a first power amplifier coupled to the first end of the transmission line over a first time period of the input signal.

Moreover, the method comprises the step of coupling-in the input signal, by a second power amplifier coupled to the second end of the transmission line, over a second time period of the input signal. In this context, the first power amplifier and/or the second power amplifier are configured to provide an output impedance equal to or close to a line impedance of the transmission line. Hence, the proposed solution does not require bulky circulators and/or complex switching arrangements and, therefore, can be effectively implemented in solid-state electronics in a simple and cost-effective manner, while achieving a compact size for the antenna system.

In an example, the method further comprises the step of activating and/or deactivating the first power amplifier over the first time period of the input signal. Additionally or alternatively, the method further comprises the step of activating and/or deactivating the second power amplifier over the second time period of the input signal. Further additionally or alternatively, the method comprises the step of activating and/or deactivating the first power amplifier and/or the second power amplifier sequentially.

For example, the first power amplifier can be configured to couple-in the input signal into the transmission line when the first power amplifier is switched-on, e.g., during the first operating period. Further, the first power amplifier can be configured to provide sufficient termination for the transmission line in order to couple-out any residual signal or energy of the input signal from the transmission line when the first power amplifier is switched-off, e.g., during the second operating period.

Analogously, the second power amplifier can be configured to couple-in the input signal into the transmission line when the second power amplifier is switched-on, e.g., during the second operating period. Further, the second power amplifier can be configured to provide sufficient termination for the transmission line in order to couple-out any residual signal or energy of the input signal from the transmission line when the second power amplifier is switched-off, e.g., during the first operating period.

BRIEF DESCRIPTION OF THE FIGURES

The above, as well as additional features, will be better understood through the following illustrative and non-limiting detailed description of example embodiments, with reference to the appended drawings.

All the figures are schematic, not necessarily to scale, and generally only show parts that are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
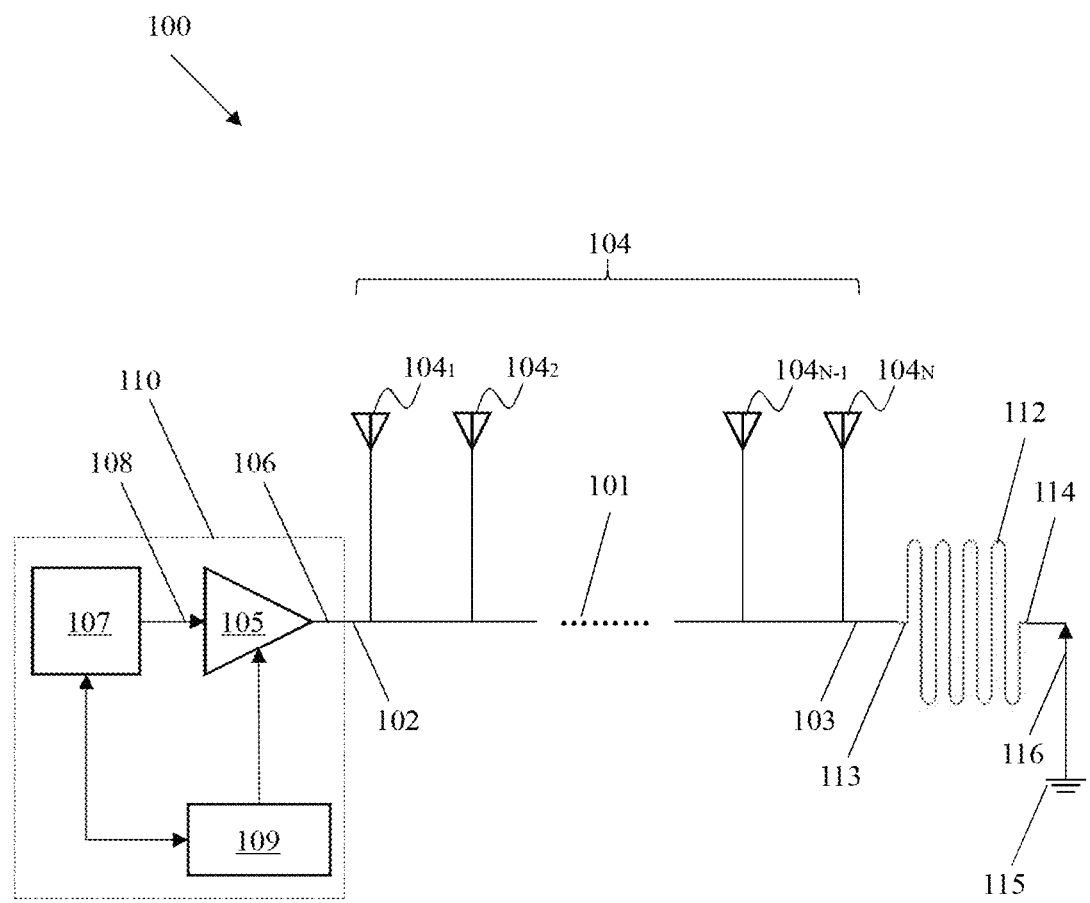
FIG. 1 shows a first antenna system, according to an example embodiment of the first aspect.

In FIG. 1, a first exemplary embodiment of the antenna system 100 according to the first aspect is illustrated. The antenna system 100 comprises a transmission line 101 having a first end 102 and a second end 103. The antenna system comprises a number of N antenna elements 104 as shown herein with the individual antenna elements $104_1$, $104_2$, ..., $104_{N-1}$, $104_N$ that form an array of antenna elements 104 or a so-called antenna array. The antenna array 104 is, in an example, implemented as a transmission line with radiating discontinuities realized in the same technology. In an example, the antenna array 104 is designed such that when an input signal with a specific energy is fed at the first end 102 of the transmission line 101, about half the energy of the signal will be radiated by the antenna array 104. Therefore, at the second end 103 of the transmission line 101, a portion of the signal with about half the energy of the input signal will remain.

The antenna system 100 further comprises a power amplifier 105 having an output node 106, where the output node 106 is coupled to the first end 102 of the transmission line 101. The power amplifier 105 couples-in an input signal 108, e.g., a periodic chirp signal, with a time period T that is, in an example, generated by a signal generator or chirp generator 107. A controller 109 is configured to switch-on or switch off the power amplifier 105, especially over specific time periods T of the input signal 108. The switching-on or switching-off of the power amplifier 105 can be achieved, for example, by switching the power amplifier supply between a supply voltage VDD and the ground, respectively.

The controller 109 further communicates with the signal generator 107 to obtain information regarding the input signal 108, e.g., time, frequency, and the like, to control the on-time and the off-time of the power amplifier 105. The power amplifier 105, the signal generator 107 and the controller 109 can be integrated into a single chirp-generating unit 110 such as a radar chip (shown as a dashed box). When the power amplifier 105 is switched-off, the output node 106 of the power amplifier 105 provides an output impedance that matches or almost matches with the line impedance of the transmission line 101 (e.g., 50 ohms). Hence, the output impedance of the power amplifier 105 at the output node 106 acts as termination for the transmission line 101 when the power amplifier 105 is switched-off.

It is to be noted that the controller 109 may not switch-off the power amplifier 105 completely, and instead may use a bias to tune the output impedance. In this regard, the controller 109 may connect the drains of the transistors of the power amplifier 105 to ground and connect the gates of the transistors to a bias voltage to tune the output impedance at the output node 106.

The antenna system further includes a delay line, and in an example, a true-time-delay line (TTDL) 112 having a first port 113 and a second port 114. The TTDL 112 further comprises a ground 115 connection at the second port 114 to provide a short circuit at the second port 114. The TTDL 112, and in an example, the first port 113 of the TTDL 112, is coupled to the second end 103 of the transmission line 101. The TTDL 112 is configured to provide a delay equal to half of the time period of the input signal 108. The TTDL 112 is, in an example, implemented as a micro-strip delay line, and hence if the antenna system 100 is realized as PCB-based micro-strip, the TTDL 112 can also be realized in the same technology and can be printed with the antenna array 104.

Therefore, for a first operating period, e.g., during the first period of the input signal 108, the controller 109 switches-on the power amplifier 105 and hence the power amplifier 105 couples-in the input signal 108 at the first end 102 of the transmission line 101. The antenna elements 104 radiate about half the energy of the input signal 108 and the remaining portion of the signal arrives at the second end 103 of the transmission line 101. At this point, the remaining signal is fed at the first port 113 of the TTDL 112 and is delayed by a half time period of the input signal 108 through the TTDL 112.

During a second operating period, e.g., during the second period of the input signal 108, the delayed signal portion is reflected back as a reflection signal 116 at the second port 114 of the TTDL 112 due to the short circuit between the second port 114 and the ground 115. The reflection signal 116 is further delayed by a half period of the input signal 108 through the TTDL 112 and is coupled-in at the second end 103 of the transmission line 101. Hence, the TTDL 112 delays the reflection signal 116 by one time period of the input signal 108.

At this point, the antenna elements 104 radiate the energy of the reflection signal 116, while the controller switches-off, either completely or partially as mentioned above, the power amplifier 105, thereby provides termination for the reflection signal 116. Hence, if any remaining energy of the reflection signal 116 persists in the transmission line 101 after radiation, the switched-off power amplifier 105, and in an example, the termination at the output node 106, will successfully couple-out the residual energy from the transmission line 101, thereby eliminating any further reflections in the opposite direction. Here, respective arrows indicate the signal directions.

Figure 2:
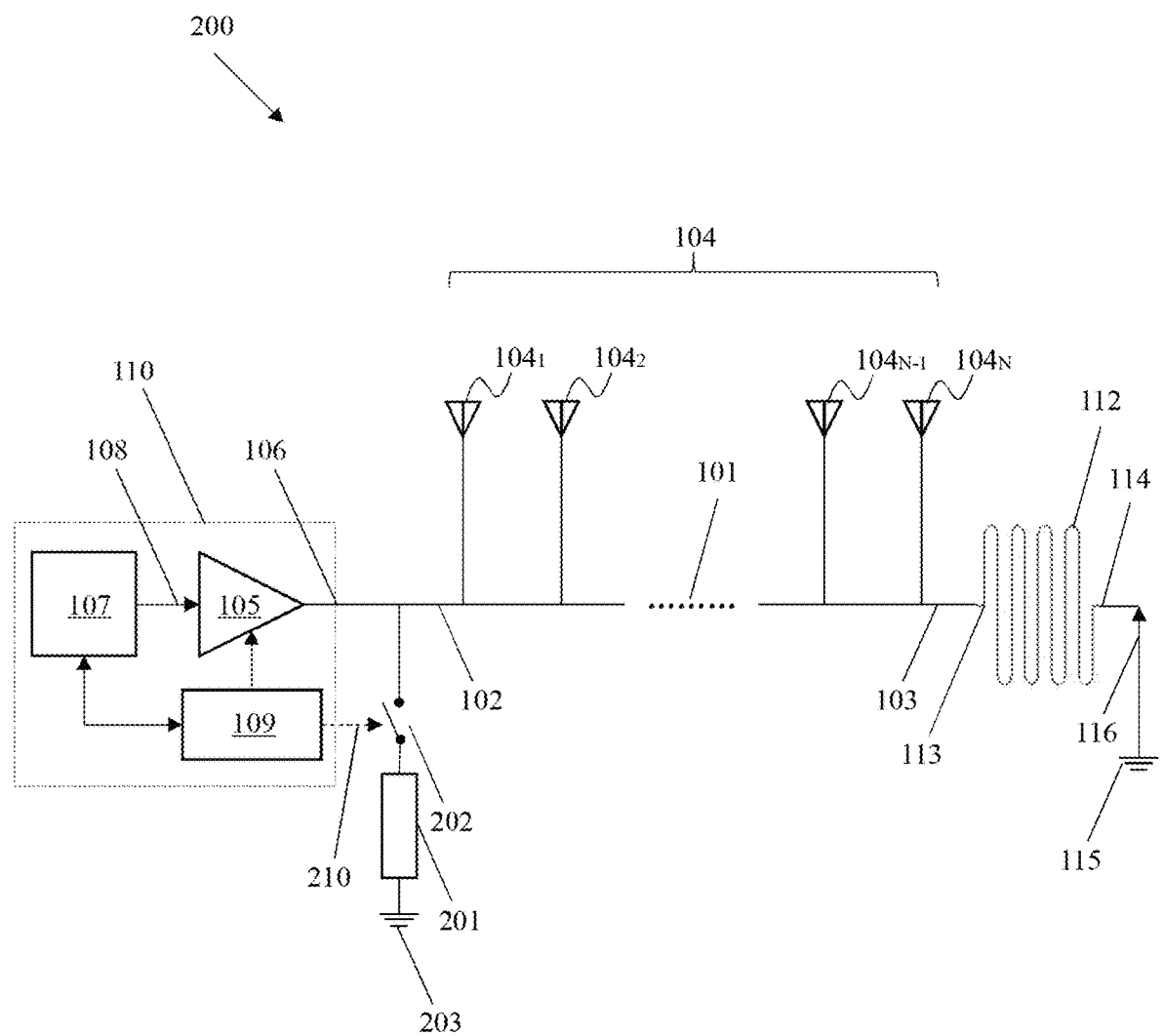
FIG. 2 shows a second antenna system, according to an example embodiment of the first aspect.

In FIG. 2, a second exemplary embodiment of the antenna system 200 according to the first aspect is illustrated. The antenna system 200 differs from the antenna system 100 of FIG. 1 in that the antenna system 200 additionally comprises a dedicated termination arrangement. In this regard, a load resistor 201 is coupled between the output port 106 of the power amplifier 105 and the first end 102 of the transmission line 101 (i.e., parallel to the output of the power amplifier 105). The load resistor 201 is coupled via a switch 202 to the output port 106 of the power amplifier 105 and is further connected to ground 203. The load resistor 201 is configured to provide an impedance equal to the line impedance of the transmission line 101.

The controller 109 operates the switch 202 via a control signal 210 to turn on or off the switch 202 so that the load resistor 201 will either be connected to the output port 106 of the power amplifier 105 or be disconnected, respectively. During the first operating period, the controller 109 switches-on the power amplifier 105 and turns-off the switch 202 (i.e., load resistor 201 disconnected). Hence, the input signal 108 is coupled into the transmission line 101 through the power amplifier 105. During the second operating period, the controller 109 switches-off the power amplifier 105 and, however, turns-on the switch 202 (i.e., the output port 106 is connected to ground 203 via the load resistor 201). Thus, the load resistor 201 acts as termination for the reflection signal 116, as described above. The load resistor 201, therefore, couples-out any remaining energy of the reflection signal 116 from the transmission line 101, thereby eliminating any further reflections in the opposite direction.

It is further possible to omit the switch 202 completely and to connect the load resistor 201 to the ground 203 permanently. This facilitates simpler implementation of the termination scheme. In addition to this or as an alternative, the load resistor 201 and the switch 202 can be replaced with a passive impedance matching network, for instance, LC networks, baluns, and so on, which can also be utilized to match the line impedance of the transmission line 101 and, therefore, act as termination for the reflection signal 116. In this regard, the output impedance requirements for the power amplifier 105 can be relaxed, which allows a more simplified implementation of the proposed solution.

Figure 3:
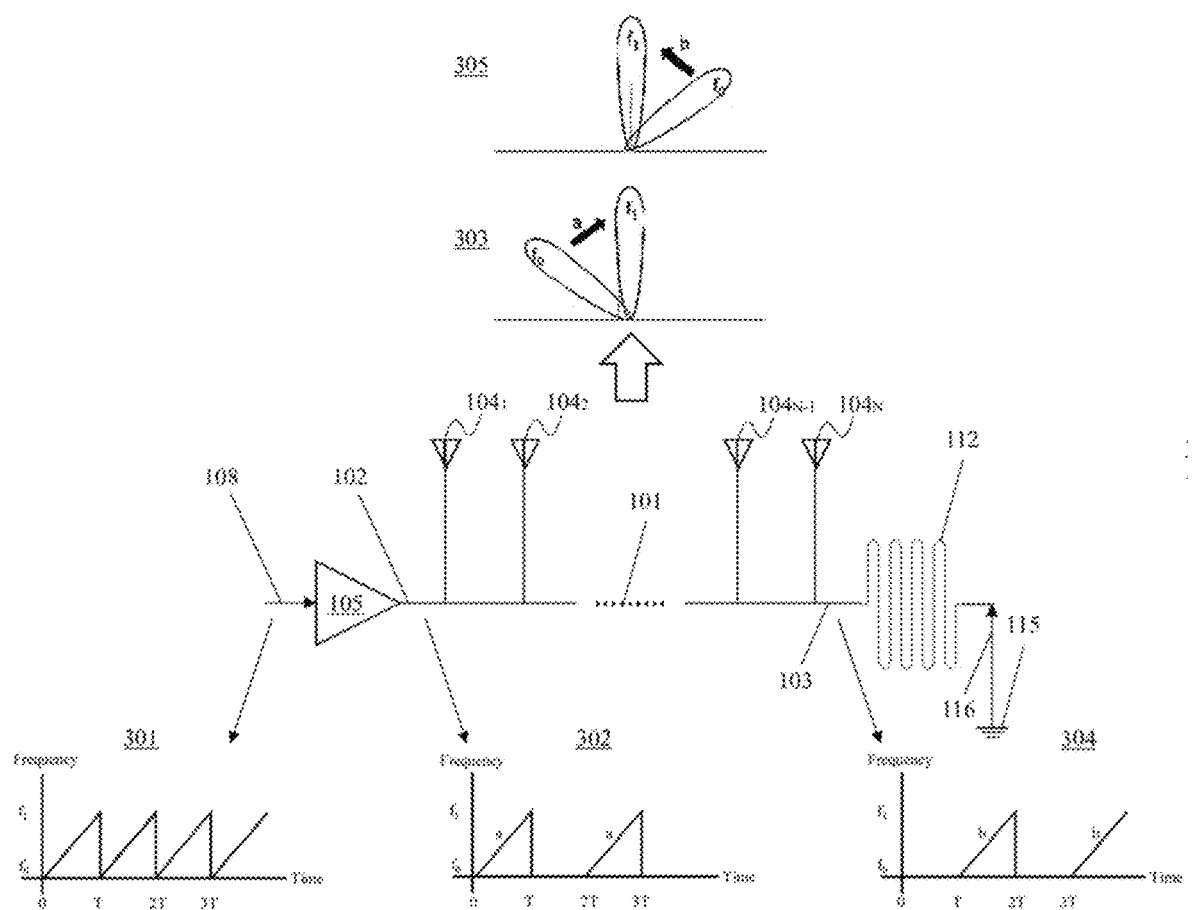
FIG. 3 shows the proposed beam steering operation for the antenna system of FIG. 1 and FIG. 2, according to an example embodiment.

In FIG. 3, the proposed beam steering technique for the antenna system 100 and/or the antenna system 200 is illustrated. Generally, the signal generator 107 generates the input signal 108, as shown here as chirp signal 301 with a ramp or frequency sweep from a frequency $f_0$ to a frequency $f_1$ over a time 0 to T. The input signal 108 is periodic with a period T, i.e., a periodic repetition of frequency sweeps over a first period 0 to T, a second period T to 2T, and so on. The ramp or frequency sweep over the first period is labeled as "a" and the ramp or frequency sweep over the second period is labeled as "b," for example.

The power amplifier 105 is switched-on for the first period 0 to T of the input signal 108, resulting in the signal 302, which is coupled-in at the first end 102 of the transmission line 101. The antenna elements $104_1$, $104_2$, ..., $104_{N-1}$, $104_N$ selectively radiate the energy so that about half of the energy of the signal 302 present at the first end 102 of the transmission line 101 is dissipated. This results in the angular coverage depicted as 303. In other words, the antenna array is exited from the left via the ramp "a" of the signal 302. The beam position will change with frequency, i.e., going from a relatively large angle with respect to broadside (perpendicular to the antenna array) at frequency $f_0$ to broadside at $f_1$.

The remaining signal is then fed to the TTDL 112, which delays the remaining signal by T/2 and the short circuit between the TTDL 112 and the ground 115 introduces the reflection signal 116 that is further delayed by T/2 by the TTDL 112. The signal present at the second end 103 of the transmission line 101 is shown as the signal 304, for instance. Hence, the signal 304 corresponds to the delayed version of the signal 302 with a delay of T. At this point, the signal 304 is fed to the second end 103 of the transmission line 101. The antenna elements $104_1$, $104_2$, ..., $104_{N-1}$, $104_N$ analogously radiate the energy, which results in the angular coverage depicted as 305.

In other words, during the second operating period, the antenna array is exited from the right via the ramp "b" of the signal 304 and the beam position will change with frequency, i.e., going from a relatively large angle with respect to broadside (perpendicular to the antenna array) at frequency $f_0$ to broadside at $f_1$. Any remaining energy of the reflection signal 116 will be coupled-out from the transmission line 101 via the termination techniques described above. Therefore, every first period of the input signal 108 ensures a scanning of the left part of the hemisphere 303 while every second period ensures a scanning of the right part of the hemisphere 305, thereby effectively doubling the angular coverage with respect to the conventional beam steering techniques.

Figure 4:
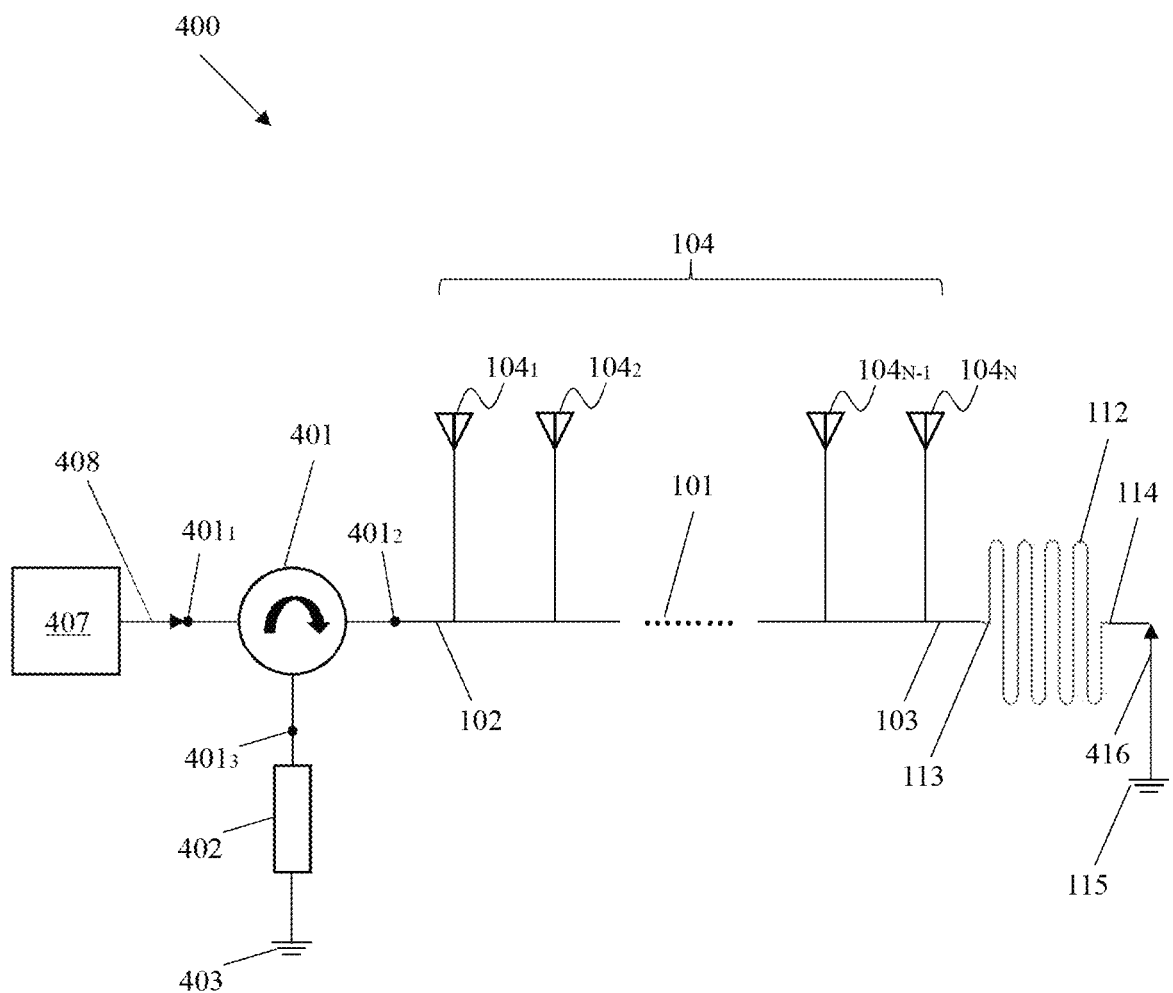
FIG. 4 shows a third antenna system, according to an example embodiment of the first aspect.

In FIG. 4, a third exemplary embodiment of the antenna system 400 according to the first aspect is illustrated. The antenna system 400 differs from the antenna system 100 of FIG. 1 in that the antenna system 400 comprises a circulator 401 that substitutes the switching-on and/or switching-off operation of the power amplifier 105 and additionally replaces the dedicated termination arrangement of the antenna system 200 of FIG. 2. The circulator 401 comprises a first port $401_1$, a second port $401_2$, and a third port $401_3$. Therefore, energy going into the first port $401_1$ exits at the second port $401_2$, energy going into the second port $401_2$ exits at the third port $401_3$, and energy going into the third port $401_3$ exits at the first port $401_1$. However, the third port $401_3$ is coupled to the ground 403 through a load resistor 402, which prevents energy flow from the third port $401_3$ to the first port $401_1$, while the load resistor 402 provides termination for the transmission line 101.

Moreover, the first port $401_1$ of the circulator 401 is coupled to a signal generation unit 407 that, in an example, comprises a signal generator and a power amplifier. The signal generation unit 407 may correspond to the chirp-generating unit 110 that comprises the signal generator 107, the power amplifier 105 and the controller 109, where the first port $401_1$ of the circulator 401 is coupled to the output port 106 of the power amplifier 105. The signal generation unit 407 generates an input signal 408 and the second port $401_2$ is coupled to the first end 102 of the transmission line 101. In this regard, the input signal 408 represents an upward ramp from a frequency $f_0$ to a frequency $f_1$ over a period 0 to T, however, repeated over a period of 2T. Hence, the input signal 408 is present during the first operating period, and during the second operating period, no signal is present.

Therefore, during the first operating period, the circulator 401 couples-in the input signal 408 from the first port $401_1$ to the second port $401_2$ and further into the transmission line 101 through the first end 102. The antenna elements $104_1$, $104_2$, . . . , $104_{N-1}$, $104_N$ radiate about half the energy of the input signal 408, which is present at the first end 102 of the transmission line 101, and the remaining portion of the signal arrives at the second end 103 of the transmission line 101. At this point, the remaining signal is fed at the first port 113 of the TTDL 112 and is delayed by a half time period of the input signal 408 through the TTDL 112.

During the second operating period, the delayed signal portion is then reflected back as a reflection signal 416 at the second port 114 of the TTDL 112 due to the short circuit between the second port 114 and the ground 115. The reflection signal 416 is further delayed by a half period of the input signal 408 through the TTDL 112 and is coupled-in at the second end 103 of the transmission line 101. Hence, the TTDL 112 delays the reflection signal 416 by one time period of the input signal 408.

At this point, the antenna elements $104_1$, $104_2$, . . . , $104_{N-1}$, $104_N$ radiate the energy of the reflection signal 416. If any remaining energy of the reflection signal 416 persists in the transmission line 101 after radiation, the circulator 401, especially through the second port $401_2$ and the third port $401_3$, and further through the load resistor 402, will successfully couple-out the residual energy from the transmission line 101, thereby eliminating any further reflections in the opposite direction. Here, respective arrows indicate the signal directions.

Figure 5:
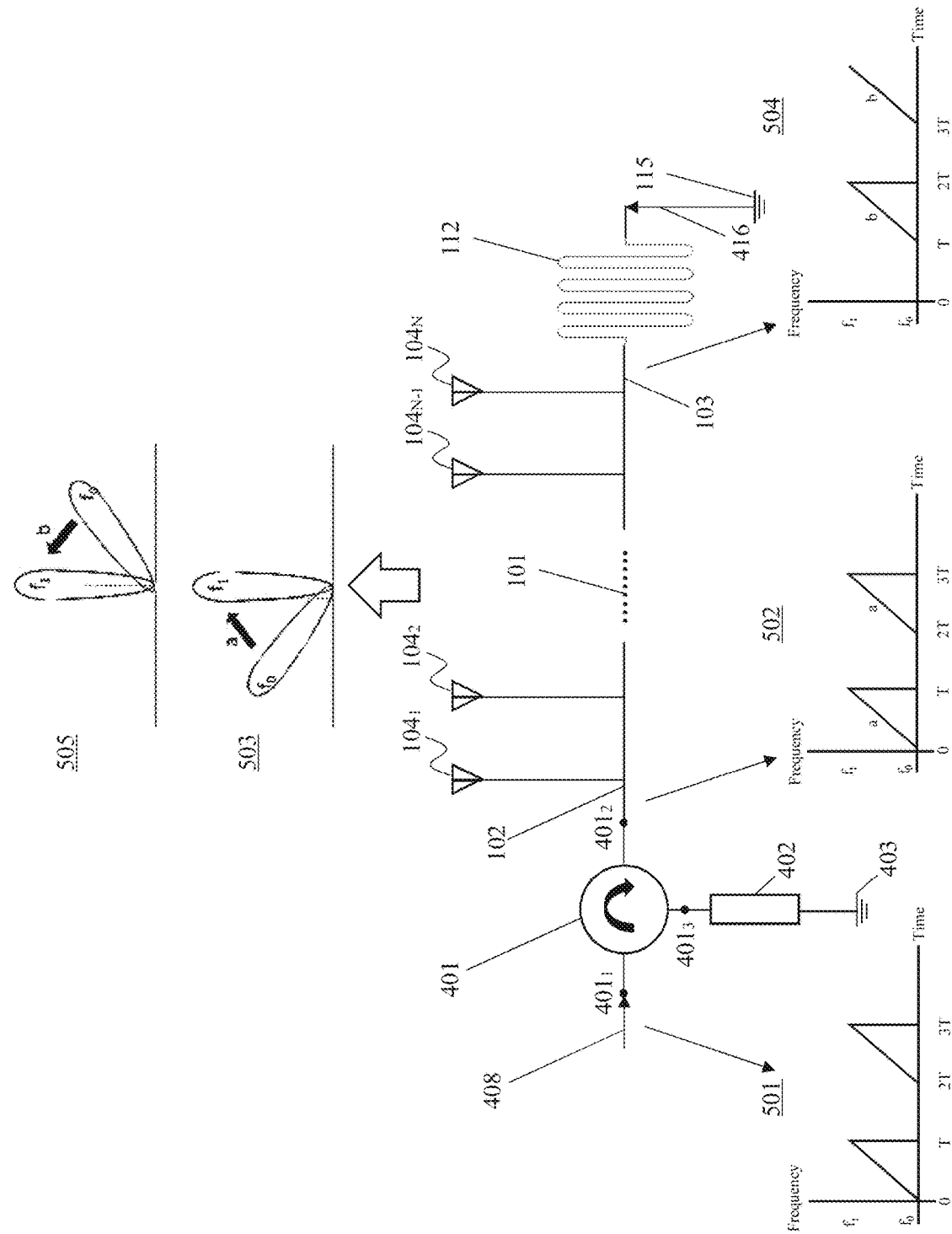
FIG. 5 shows the proposed beam steering operation for the antenna system of FIG. 4, according to an example embodiment.

In FIG. 5, the proposed beam steering technique for the antenna system 400 is illustrated. The signal generation unit 407 generates the input signal 408, as shown here as chirp signal 501 with a ramp or frequency sweep from a frequency $f_0$ to a frequency $f_1$ over a time 0 to T and no frequency sweep over a time T to 2T. Hence, with respect to the input signal 408, the first operating period represents the period over the time 0 to T where the signal is present and the second operating period represents the period over a time T to 2T where no signal is present, and so on.

During the first operating period, the circulator 401 couples-in the input signal 408 at the first end 102 of the transmission line 101, which is shown as the signal 502 and the ramp is labelled as "a." The antenna elements $104_1$, $104_2$, . . . , $104_{N-1}$, $104_N$ selectively radiate the energy so that about half of the energy of the input signal 408, i.e., the signal 501 resp. the signal 502 present at the first end 102 of the transmission line 101 is dissipated. This results in the angular coverage depicted as 503. In other words, the antenna array is exited from the left via the ramp "a" of the signal 502, the beam position will change with frequency, i.e., going from a relatively large angle with respect to broadside (perpendicular to the antenna array) at frequency $f_0$ to broadside at $f_1$.

The remaining signal is then fed to the TTDL 112, which delays the remaining signal by T/2 and the short circuit between the TTDL 112 and the ground 115 introduces the reflection signal 416, which is further delayed by T/2 by the TTDL 112. The signal present at the second end 103 of the transmission line 101 is shown as the signal 504 and the ramp is labelled as "b," for instance. Hence, the signal 504 corresponds to the delayed version of the signal 502 with a delay of T. At this point, the signal 504 is fed to the second end 103 of the transmission line 101. The antenna elements $104_1$, $104_2$, . . . , $104_{N-1}$, $104_N$ analogously radiate the energy, which results in the angular coverage depicted as 505.

In other words, during the second operating period, the antenna array is exited from the right via the ramp "b" of the signal 504 and the beam position will change with frequency, i.e., going from a relatively large angle with respect to broadside (perpendicular to the antenna array) at frequency $f_0$ to broadside at $f_1$. Any remaining energy of the reflection signal 416 will be coupled-out from the transmission line 101 via the termination provided by the load resistor 402, coupled at the third port $401_3$ of the circulator 401. Therefore, every first operating period ensures a scanning of the left part of the hemisphere 503, while every second operating period ensures a scanning of the right part of the hemisphere 505, thereby effectively doubling the angular coverage with respect to the conventional beam steering techniques.

Figure 6:
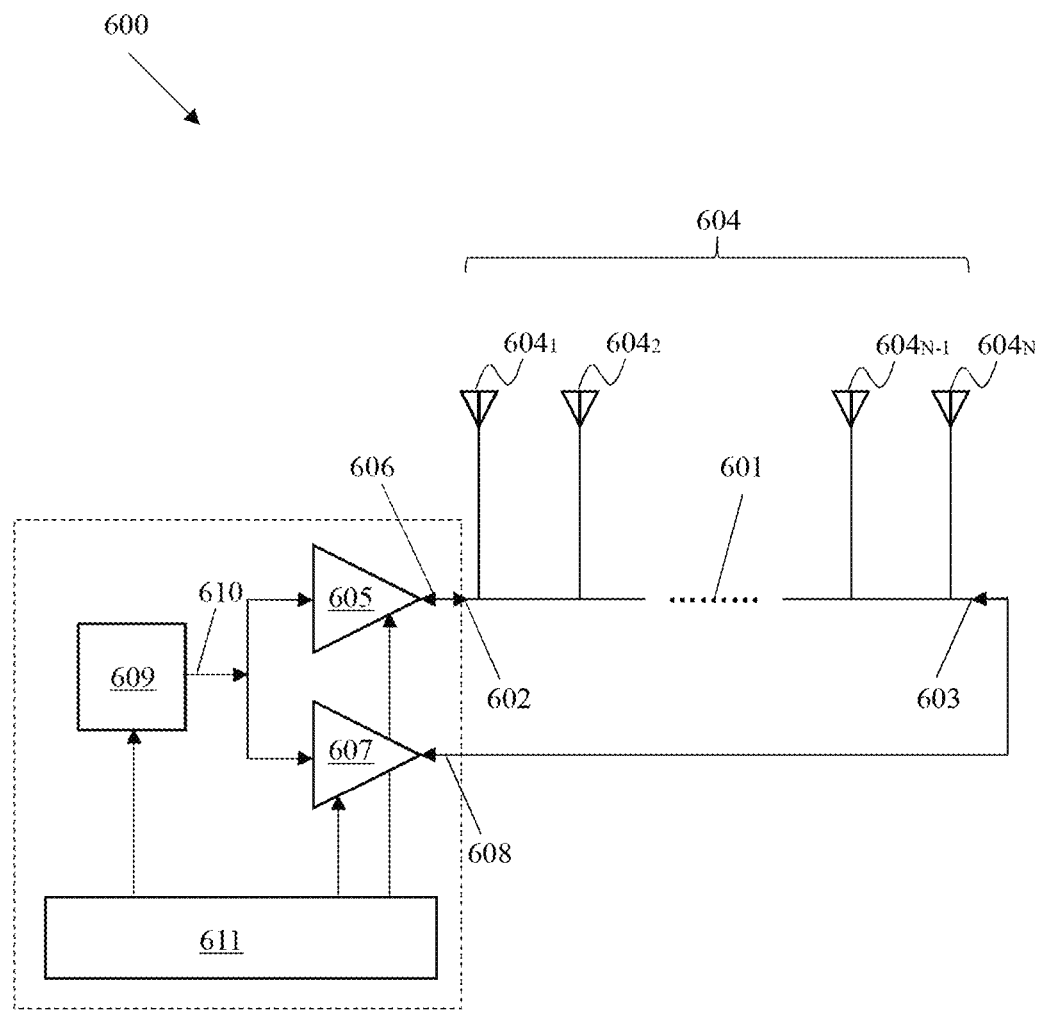
FIG. 6 shows an antenna system, according to an example embodiment of the second aspect.

In FIG. 6, an exemplary embodiment of the antenna system 600 according to the second aspect is illustrated. The antenna system 600 comprises a transmission line 601 having a first end 602 and a second end 603. The antenna system comprises a number of N antenna elements 604 as shown herein with the individual antenna elements $604_1$, $604_2$, . . . , $604_{N-1}$, $604_N$ that form an array of antenna elements 604 or a so-called antenna array. The antenna array 604 is, in an example, implemented as a transmission line with radiating discontinuities realized in the same technology. In an example, the antenna array 604 is designed such that when an input signal with a specific energy is fed at the first end 602 of the transmission line 601, almost all the energy of the input signal will be radiated by the antenna array 604.

The antenna system 600 further comprises a first power amplifier 605 having an output node 606, where the output node 606 is coupled to the first end 602 of the transmission line 601. Moreover, the antenna system 600 comprises a second power amplifier 607 having an output node 608, where the output node 608 is coupled to the second end 603 of the transmission line 601. A signal generator 609 generates an input signal 610, which can be represented as a periodic chirp signal with a period of T. In this regard, a first period over the time 0 to T may correspond to a first operating period and a second period over the time T to 2T may correspond to a second operating period, and so on.

The antenna system 600 further comprises a controller 611, which is configured to switch-on or switch off the first power amplifier 605 and the second power amplifier 607, especially over specific time periods T of the input signal 610. The switching-on or switching-off of the first power amplifier 605 and the second power amplifier 607 can be achieved, for example, by switching the power amplifier supply between a supply voltage VDD and ground, respectively. The controller 611 is, in an example, implemented with a sequential logic or a finite state machine.

The controller 611 further controls the signal generator 609 to synchronize the first power amplifier 605 and the second power amplifier 607 over the first operating period and the second operating period, respectively, or vice versa. In other words, the controller 611 controls the sequential operation of the first power amplifier 605 and the second power amplifier 607, i.e., turning-on and/or turning-off the first power amplifier 605 and the second power amplifier 607 sequentially, over the successive periods of operation, i.e., the successive periods of the input signal 610.

The first power amplifier 605, the second power amplifier 607, the signal generator 609, and the controller 611 can be integrated into a single chirp-generating unit such as a radar chip (shown as a dashed box).

When the first power amplifier 605 is switched-off, the output node 606 of the first power amplifier 605 provides an output impedance that matches or almost matches with the line impedance of the transmission line 601 (e.g., 50 ohms). Hence, the output impedance at the output node 606 acts as termination for the transmission line 601 when the first power amplifier 605 is switched-off. Analogously, when the second power amplifier 607 is switched-off, the output node 608 of the second power amplifier 607 provides an output impedance that matches or almost matches with the line impedance of the transmission line 601 (e.g., 50 ohms). Hence, the output impedance at the output node 608 acts as termination for the transmission line 601 when the second power amplifier 607 is switched-off.

It is to be noted that the controller 611 may not switch-off the first power amplifier 605 and/or the second power amplifier 607 completely, and may instead use a bias (e.g., bias current or bias voltage) to tune the output stage of the amplifier. In other words, the controller 611 may tune the biasing of the power amplifier, thereby tuning the output impedance of the amplifier to provide sufficient impedance matching with respect to the line impedance of the transmission line 601.

For example, for the first operating period, e.g., during the first period of the input signal 610, the controller 611 switches-on the first power amplifier 605 and switches-off the second power amplifier 607. Hence, the first power amplifier 605 couples-in the input signal 610 at the first end 602 of the transmission line 601 over the first period of the input signal 610. In an example, the antenna elements 604 radiate almost all the energy of the input signal 610, resp. the energy of the signal present at the first end 602 of the transmission line 601. However, in practice, this is not the case and a portion of the energy from the input signal 610 persists in the transmission line 601. As a result, the remaining portion of the input signal 610 arrives at the second end 603 of the transmission line 601 and eventually terminated at the termination provided by the output impedance of the second power amplifier 607 at the output node 608.

For the second operating period, e.g., during the second period of the input signal 610, the controller 611 switches-off the first power amplifier 605 and switches-on the second power amplifier 607. Hence, the second power amplifier 607 couples-in the input signal 610 at the second end 603 of the transmission line 601 over the second period of the input signal 610. In an example, the antenna elements 604 radiates almost all the energy of the input signal 610, resp. the energy of the signal present at the second end 603 of the transmission line 601. However, in practice, this is not the case and a portion of the energy from the input signal 610 persists in the transmission line 601. As a result, the remaining portion of the input signal 610 arrives at the first end 602 of the transmission line 601 and is eventually terminated at the termination provided by the output impedance of the first power amplifier 605 at the output node 606. Here, respective arrows indicate the signal directions.

Figure 7:
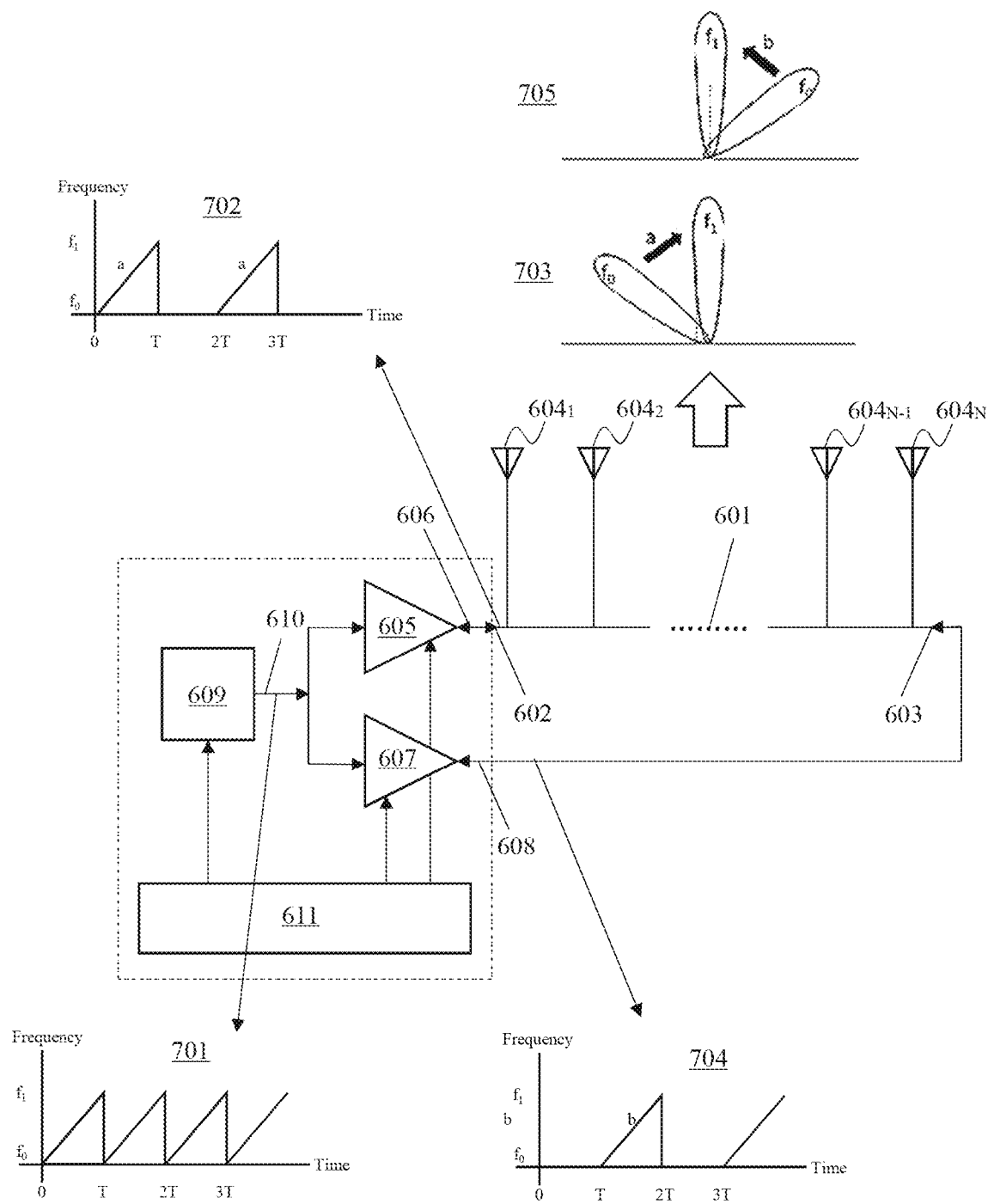
FIG. 7 shows the proposed beam steering operation for the antenna system of FIG. 6, according to an example embodiment.

In FIG. 7, the proposed beam steering technique for the antenna system 600 is illustrated. Generally, the signal generator 609 generates the input signal 610, as shown here as chirp signal 701 with a ramp or frequency sweep from a frequency $f_0$ to a frequency $f_1$ over a time 0 to T. The input signal 610 is periodic with a period T, i.e., a periodic repetition of frequency sweeps over a first period 0 to T, a second period T to 2T, and so on. The ramp or frequency sweep over the first period is labeled as "a" and the ramp or frequency sweep over the second period is labeled as "b," for example.

For instance, consider the case where the first power amplifier 605 is switched-on and the second power amplifier 607 is switched-off for the first period 0 to T of the input signal 610. This results in the signal 702 at the output of the first power amplifier 605, which is coupled-in at the first end 602 of the transmission line 601 by the first power amplifier 605, while the second power amplifier 607 does not input any signal into the transmission line 601. The antenna elements $604_1$, $604_2$, ..., $604_{N-1}$, $604_N$ selectively radiate the energy, and in an example, most of the energy of the signal 702, so that almost all of the energy is dissipated.

This results in the angular coverage depicted as 703. In other words, the antenna array is exited from the left via the ramp "a" of the signal 702, the beam position will change with frequency, i.e., going from a relatively large angle with respect to broadside (perpendicular to the antenna array) at frequency $f_0$ to broadside at $f_1$. However, if any residual energy persists in the transmission line 601, the remaining signal is then terminated at the second power amplifier 607, and in an example, at the matched termination provided at the output node 608 of the second power amplifier 607.

Furthermore, consider the case where the first power amplifier 605 is switched-off and the second power amplifier 607 is switched-on for the second period T to 2T of the input signal 610. This results in the signal 704 at the output of the second power amplifier 607, which is coupled-in at the second end 603 of the transmission line 601 by the second power amplifier 607, while the first power amplifier 605 does not input any signal into the transmission line 601. The antenna elements $604_1$, $604_2$, ..., $604_{N-1}$, $604_N$ selectively radiate the energy, and in an example, most of the energy of the signal 704, so that almost all of the energy is dissipated.

This results in the angular coverage depicted as 705. In other words, the antenna array is exited from the right via the ramp "b" of the signal 704, the beam position will change with frequency, i.e., going from a relatively large angle with respect to broadside (perpendicular to the antenna array) at frequency $f_0$ to broadside at $f_1$. However, if any residual energy persists in the transmission line 601, the remaining signal is then terminated at the first power amplifier 605, and in an example, at the matched termination provided at the output node 606 of the first power amplifier 605.

Therefore, every first period of the input signal 610 ensures a scanning of the left part of the hemisphere 703 while every second period ensures a scanning of the right part of the hemisphere 705, thereby effectively doubling the angular coverage with respect to the conventional beam steering techniques.

Figure 8:
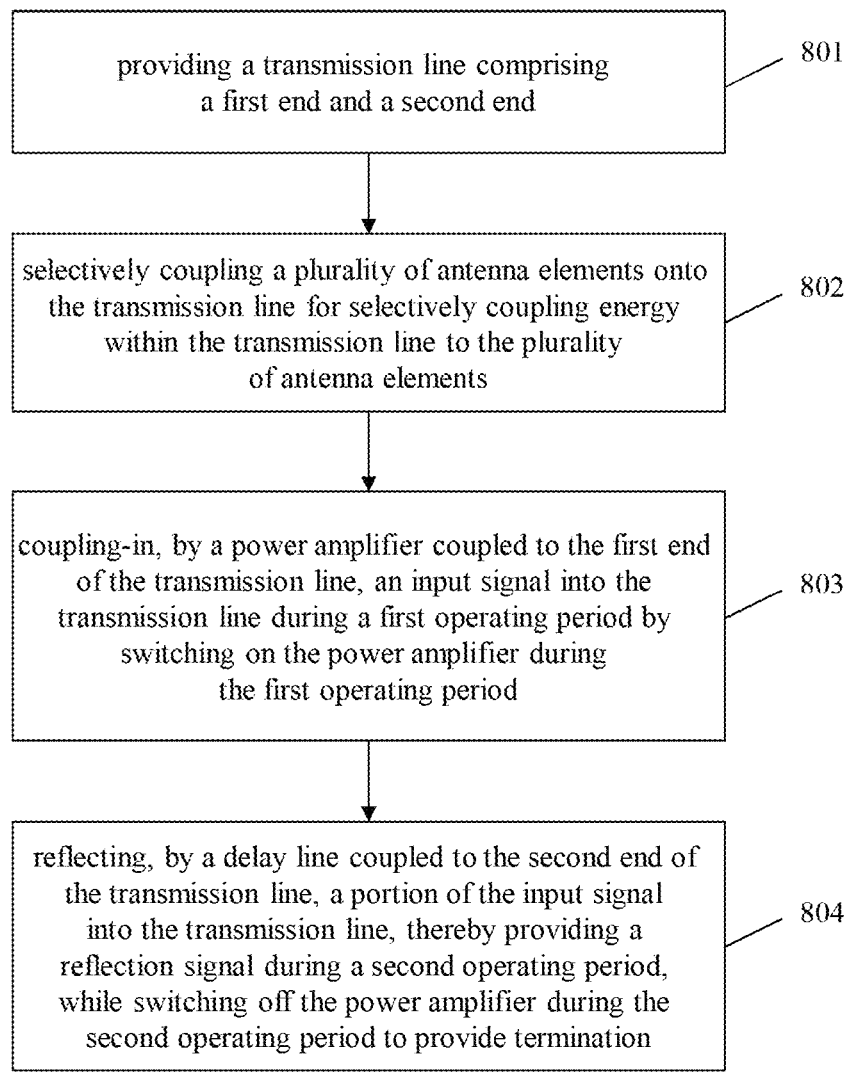
FIG. 8 shows a method, according to an example embodiment of the third aspect.

In FIG. 8, an exemplary embodiment of the method according to the third aspect is illustrated. In a first step 801, a transmission line comprising a first end and a second end is provided. In a second step 802, a plurality of antenna elements is selectively coupled onto the transmission line for selectively coupling energy within the transmission line to the plurality of antenna elements. In a third step 803, an input signal is coupled-in into the transmission line by a power amplifier coupled to the first end of the transmission line during a first operating period, especially by switching-on the power amplifier during the first operating period. In a fourth step 804, a portion of the input signal is reflected into the transmission line by a delay line coupled to the second end of the transmission line, thereby providing a reflection signal during a second operating period, while the power amplifier is switched-off during the second operating period to provide termination for the transmission line.

Figure 9:
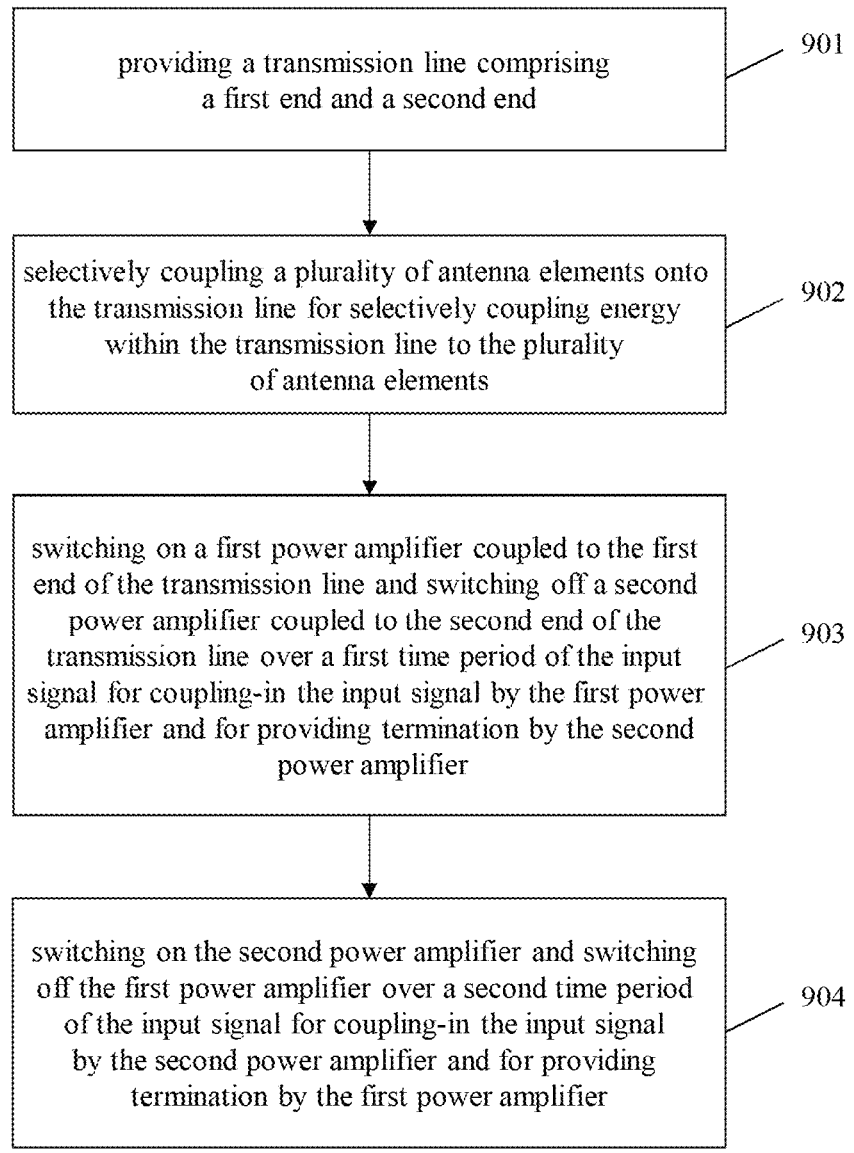
FIG. 9 shows another method, according to an example embodiment of the fourth aspect.

In FIG. 9, an example embodiment of the method according to the fourth aspect is illustrated. In a first step 901, a transmission line comprising a first end and a second end is provided. In a second step 902, a plurality of antenna elements is selectively coupled onto the transmission line for selectively coupling energy within the transmission line to the plurality of antenna elements. In a third step 903, a first power amplifier coupled to the first end of the transmission line is switched-on and a second power amplifier coupled to the second end of the transmission line is switched-off over a first time period of the input signal to couple-in the input signal into the transmission line by the first power amplifier and to provide termination for the transmission line by the second power amplifier. In a fourth step 904, the second power amplifier coupled to the second end of the transmission line is switched-on and the first power amplifier coupled to the first end of the transmission line is switched-off over a second time period of the input signal to couple-in the input signal into the transmission line by the second power amplifier and to provide termination for the transmission line by the first power amplifier.

The embodiments can be implemented by hardware, software, or any combination thereof. Various embodiments may be implemented by one or more application-specific integrated circuits (ASICs), digital signal processors (DSPs), digital signal processing devices (DSPDs), programmable logic devices (PLDs), field-programmable gate arrays (FPGAs), processors, controllers, microcontrollers, microprocessors, or the like.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A beam-steering antenna system for improving angular coverage comprising:
    a transmission line comprising a first end and a second end;
    a plurality of antenna elements implemented as part of the transmission line including one or more radiating discontinuities that couple energy within the transmission line to the plurality of antenna elements;
    a power amplifier coupled to the first end of the transmission line and configured to couple-in an input signal into the transmission line during a first operating period; and
    a delay line coupled to the second end of the transmission line and configured to reflect a portion of the input signal into the transmission line, thereby providing a reflection signal during a second operating period; and
    wherein the power amplifier is further configured to:
        switch on for the first operating period to couple-in the input signal into the transmission line; and
        switch-off for the second operating period to provide termination for the reflection signal.

2. The beam-steering antenna system according to claim 1, wherein the first operating period and the second operating period correspond to one time period of the input signal.

3. The beam-steering antenna system according to claim 2, wherein the delay line is a true-time-delay line further configured to delay the reflection signal for one time period of the input signal.

4. The beam-steering antenna system according to claim 3, wherein the power amplifier is further configured to provide an output impedance equal or close to a line impedance of the transmission line.

5. The beam-steering antenna system according to claim 1, wherein the delay line is a true-time-delay line further configured to delay the reflection signal for one time period of the input signal.

6. The beam-steering antenna system according to claim 1, wherein the power amplifier is further configured to provide an output impedance equal or close to a line impedance of the transmission line.

7. The beam-steering antenna system according to claim 1, wherein the power amplifier is further configured to be switched on for the first operating period to couple-in the input signal into the transmission line and is further configured to be switched-off for the second operating period to provide termination for the reflection signal.

8. The beam-steering antenna system according to claim 1, wherein the plurality of antenna elements corresponds to radiating micro-strip transmission line corner-discontinuities, and the delay line corresponds to a micro-strip delay line.

9. A method for improving angular coverage of a beam-steering antenna system comprises:
    providing a transmission line that comprises a first end and a second end;
    providing a plurality of antenna elements implemented as part of the transmission line including one or more radiating discontinuities that connect to the transmission line and couple energy within the transmission line to the plurality of antenna elements;
    coupling-in, by a power amplifier coupled to the first end of the transmission line, an input signal into the transmission line during a first operating period; and
    reflecting, by a delay line coupled to the second end of the transmission line, a portion of the input signal into the transmission line, thereby providing a reflection signal during a second operating period;
    wherein, coupling-in by the power amplifier further includes:
    switching on the power amplifier for the first operating period; and
    switching off the power amplifier for the second operating period.

10. The method according to claim 9, wherein the delay line is a true-time-delay line further configured to delay the reflection signal for one time period of the input signal.

11. The method according to claim 9, further comprising, providing, by the power amplifier, an output impedance equal or close to a line impedance of the transmission line.

12. The method according to claim 9, wherein the plurality of antenna elements corresponds to radiating micro-strip transmission line corner-discontinuities, and the delay line corresponds to a micro-strip delay line.

13. The method according to claim 9, wherein the first operating period and the second operating period correspond to one time period of the input signal.

\* \* \* \* \*